(12) United States Patent
Kim et al.

(10) Patent No.: US 6,365,487 B2
(45) Date of Patent: Apr. 2, 2002

(54) METHOD OF MANUFACTURING A CAPACITOR IN A SEMICONDUCTOR DEVICE

(75) Inventors: Kyong Min Kim, Anyang-Shi; Han Sang Song, Seoul; Dong Jun Kim, Ichon-Shi, all of (KR)

(73) Assignee: Hyundai Electronics Industries, Co., Ltd., Kyungki-Do (KR)

( * ) Notice: Subject to any disclaimer, the term of this patent is extended or adjusted under 35 U.S.C. 154(b) by 0 days.

(21) Appl. No.: 09/852,929

(22) Filed: May 10, 2001

(30) Foreign Application Priority Data

Jun. 30, 2000 (KR) ............................................. 00-37040

(51) Int. Cl.[7] ................................................ H01L 21/20
(52) U.S. Cl. ....................................... 438/393; 438/240
(58) Field of Search .................... 438/240, 393, 438/592, 629, 639, 643, 648, 653, 680, 685, 909, 238, 396, 738

(56) References Cited

U.S. PATENT DOCUMENTS

| | | | |
|---|---|---|---|
| 5,637,533 A | * | 6/1997 | Choi ........................... 438/643 |
| 5,702,970 A | * | 12/1997 | Choi ............................. 438/3 |
| 5,879,957 A | * | 3/1999 | Joo ............................... 438/3 |
| 6,207,557 B1 | * | 3/2001 | Lee et al. ..................... 438/648 |
| 6,326,259 B1 | * | 12/2001 | Kim et al. ..................... 438/240 |

* cited by examiner

*Primary Examiner*—David Nelms
*Assistant Examiner*—Phuc T. Dang
(74) *Attorney, Agent, or Firm*—Merchant, Gerstein & Borun

(57) ABSTRACT

A method of manufacturing a capacitor in a semiconductor device wherein a first a Ru film used as a lower electrode is deposited by an LPCVD method, a mixed plasma process of Ar and $H_2$ is performed, and a second Ru film is deposited by an LPCVD method, thus improving the surface roughness of the Ru film. The method can obtain a high capacitance and a low leakage current in a capacitor using a $Ta_2O_5$ film as a dielectric film.

10 Claims, 1 Drawing Sheet

METHOD OF MANUFACTURING A CAPACITOR IN A SEMICONDUCTOR DEVICE

BACKGROUND OF THE INVENTION

1. Field of the Invention

The invention relates generally to a method of manufacturing a capacitor in a semiconductor device. More particularly, the invention relates to a method of manufacturing a capacitor in a semiconductor device, which can obtain a high capacitance and a low leakage current in a capacitor using a $Ta_2O_5$ film as a dielectric film, in such a way that a first Ru film used as a lower electrode is deposited by an LPCVD method, a mixture plasma process of Ar and $H_2$ is performed, and then a second Ru film is deposited by an LPCVD method to improve the surface roughness of the Ru film.

2. Description of the Prior Art

As a semiconductor device is highly integrated, in order to secure the capacitance of a capacitor using a $Ta_2O_5$ film having a conventional MIS (metal-insulator-silicon) structure as a dielectric film, the thickness of the $Ta_2O_5$ film is reduced. This method, however, causes increases in the leakage current. In order to solve this problem, a method in which a metal layer is used as a lower electrode to lower the effective thickness and to secure a capacitance and the characteristic of a leakage current, has been attempted. If a metal layer is used as the lower electrode, the characteristic of a leakage current can be improved due to the thin quality of the lower electrode.

For example, in order to form the Ru film as the lower electrode, an LPCVD method is employed. If the Ru film is formed by an LPCVD method, as the surface roughness is poor, some of the Ru film is deposited as the seed layer by a PVD method, and the Ru film is then deposited by the LPCVD method, thus improving the surface roughness. In this case, however, the process is complicated and the step coverage is adversely affected.

SUMMARY OF THE INVENTION

A method of manufacturing a capacitor in a semiconductor device includes the steps of depositing a first Ru film on a semiconductor substrate in which a given structure is formed; processing the first Ru film by exciting a mixture plasma of Ar and $H_2$; depositing a second Ru film on the first Ru film to form a second deposited Ru film, then patterning the second deposited Ru film to form a lower electrode; forming a $Ta_2O_5$ film on the entire structure; and forming a TiN film on the entire structure and then patterning the TiN film to form an upper electrode.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

It is an objective of this disclosure to provide a method of manufacturing a capacitor in a semiconductor device capable of improving an electrical characteristic of the capacitor by improving the surface roughness when a Ru film is formed as a lower electrode.

The method can obtain a high capacitance and a low leakage current in a capacitor using a $Ta_2O_5$ film as a dielectric film, by first depositing a first Ru film used as a lower electrode by an LPCVD method, performing a mixture plasma process of Ar and $H_2$, and depositing a second Ru film by an LPCVD method to improve the surface roughness of the Ru film.

The disclosed method will be described in detail by way of a preferred embodiment with reference to accompanying drawings.

Figure 1A:
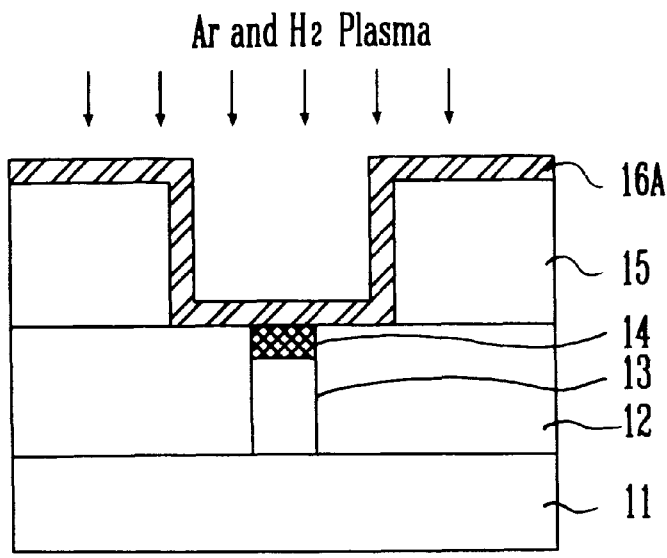
FIGS. 1A–1C are cross-sectional views of a device for explaining a method of manufacturing a capacitor in a semiconductor device according to the present invention.

Referring to FIG. 1A, after an insulating film 12 is formed on a semiconductor substrate 11 in which a predetermined structure is formed, a selected region of the insulating film 12 is etched to form a contact hole through which a selected region of the semiconductor substrate 11 is exposed. Then, a polysilicon plug 13 and a diffusion prevention film 14 (e.g., a Ti/TiN film) are stacked to fill the contact hole. After an oxide film 15 is formed on the entire structure, a capacitor of a cylinder shape is etched so that a portion of the underlying contact hole can be exposed. Next, a first Ru film 16A is deposited on the entire structure by an LPCVD method, and is then processed by exciting a mixture plasma of Ar and $H_2$. At this time, the RF power for exciting the plasma is maintained at about 10 W to about 1000 W. Meanwhile, when the RF power is applied, a sub heater is used as a ground and a shower head is used as an electrode. The first Ru film 16A is deposited by vaporizing tris (2,4-octanedionato) ruthenium and then introducing the vaporized tris (2,4-octanedionato) ruthenium into a reaction furnace containing a wafer, and in which a pressure of about 0.1 Torr to about 10 Torr is maintained. At this time, a reaction gas uses oxygen at a flow rate of about 5 sccm to about 1000 sccm and the wafer within the reaction furnace is heated to a temperature of about 200° C. to about 350° C.

Figure 1B:
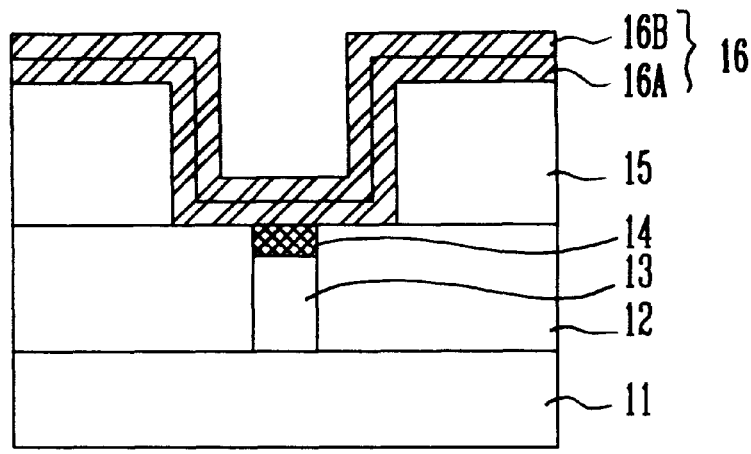

Referring to FIG. 1B, a second Ru film 16B is deposited on the first Ru film 16A and processed by plasma by an LPCVD method, thus forming a secondly-deposited Ru film 16. The second Ru film 16B is deposited in the same manner as the first Ru film 16A.

Figure 1C:
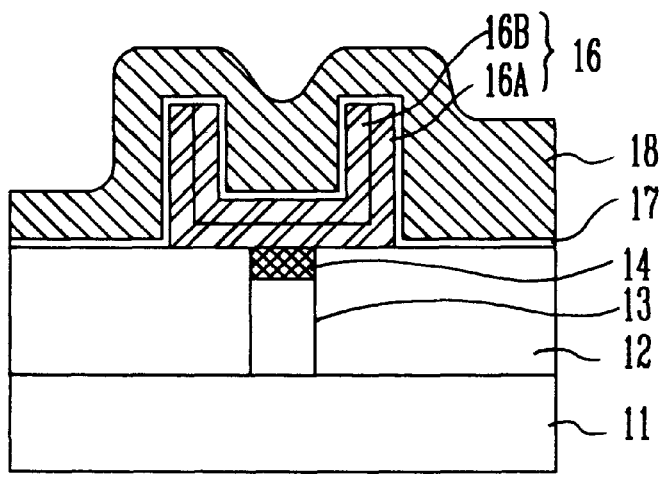

Referring to FIG. 1C, the Ru film 16 is polished to expose the oxide film 15, thus forming a lower electrode. After the oxide film 15 is removed, a $Ta_2O_5$ film 17 is formed on the entire structure. The $Ta_2O_5$ film 17 is formed by vaporizing tantalum ethylate $Ta(OC_2H_5)_5$ in a vaporizer within which a temperature of about 170° C. to about 190° C. is maintained, and then the vaporized tantalum ethylate is introduced into a reaction furnace containing a wafer, and in which a pressure of about 0.1 Torr to about 1.2 Torr is maintained. At this time, oxygen at a flow rate of about 10 sccm to about 1000 sccm is used as a reaction gas, and the wafer within the reaction furnace is heated to a temperature of about 300° C. to about 400° C. After the $Ta_2O_5$ film 17 is formed, $N_2O$ plasma or a $UV/O_3$ process is performed at the temperature of about 300° C. to about 500° C. and a rapid thermal process or reactor annealing process is performed at the temperature of about 500° C. to about 700° C. using $N_2$ gas and $O_2$ gas. After a Ru film or a TiN film 18 is deposited on the entire structure, it is patterned to form an upper electrode.

As mentioned above, the method can obtain a high capacitance and a low leakage current in a capacitor using a $Ta_2O_5$ film as a dielectric film, by firstly depositing a Ru film used as a lower electrode by an LPCVD method, performing a mixture plasma process of Ar and $H_2$ and secondly depositing the Ru film by an LPCVD method to improve the surface roughness of the Ru film.

The method has been described with reference to a particular embodiment in connection with a particular application. Those having ordinary skill in the art and access to the teachings of the method will recognize additional modifications and applications within the scope thereof.

It is therefore intended by the appended claims to cover any and all such applications, modifications, and embodiments within the scope of the invention.

What is claimed is:

1. A method of manufacturing a capacitor in a semiconductor device, comprising the steps of:

providing a semiconductor substrate in which a predetermined structure is formed;

depositing a first Ru film on said substrate by means of an LPCVD method;

processing said first Ru film by exciting a mixed-plasma of Ar and $H_2$ to improve the surface roughness;

depositing a second Ru film on said first Ru film to form a second Ru film;

patterning the second Ru film to form a lower electrode;

forming a $Ta_2O_5$ film on the entire structure including the lower electrode;

forming a TiN film on the $Ta_2O_5$ film; and patterning the TiN film to form an upper electrode.

2. The method of claim 1, comprising the step of forming said first Ru film by vaporizing tris (2,4-octanedionato) ruthenium and then introducing the vaporized tris (2,4-octanedionato) ruthenium into a reaction furnace containing a wafer, within which a pressure of about 0.1 Torr to about 10 Torr is maintained, and heating the wafer to a temperature of about 200° C. to about 350° C.

3. The method of claim 2, comprising the step of introducing oxygen at a flow rate of about 5 sccm to about 1000 sccm as a reaction gas to said reaction furnace for forming said first Ru film.

4. The method of claim 1, comprising the step of exciting the mixture plasma of Ar and $H_2$ by applying a RF power of about 10 W to about 1000 W.

5. The method of claim 1, comprising the step of forming said second Ru film by vaporizing tris (2,4-octanedionato) ruthenium and then introducing said tris (2,4-octanedionato) ruthenium into a reaction furnace containing a wafer within which a pressure of about 0.1 Torr to about 10 Torr is maintained, and heating the wafer to a temperature of about 200° C. to about 350° C.

6. The method of claim 5, comprising the step of introducing oxygen at a flow rate of about 5 sccm to about 1000 sccm as a reaction gas to said reaction furnace for forming said second Ru film.

7. The method of claim 1, comprising the step of forming said $Ta_2O_5$ film by vaporizing tantalum ethylate $Ta(OC_2H_5)_5$) and then introducing said tantalum ethylate into a reaction furnace containing a wafer, within which a pressure of about 0.1 Torr to about 1.2 Torr is maintained, and heating the wafer to a temperature of about 300° C. to about 400° C.

8. The method of claim 7, comprising the step of introducing oxygen to the furnace at a flow rate of about 10 sccm to about 1000 sccm as a reaction gas for forming said $Ta_2O_5$ film.

9. The method of claim 1, further including, after said $Ta_2O_5$ film is formed, a step of performing a $N_2O$ plasma or $UV/O_3$ process at a temperature of about 300° C. to about 500° C. and a rapid thermal process or reactor annealing-process at a temperature of about 500° C. to about 700° C. using $N_2$ gas and $O_2$ gas.

10. The method of claim 1, comprising the step of forming a Ru film instead of the TiN film as an upper electrode.

* * * * *